US 8,576,630 B2

United States Patent
Liu et al.

(10) Patent No.: US 8,576,630 B2
(45) Date of Patent: Nov. 5, 2013

(54) NON-VOLATILE MEMORY DEVICE WITH PLURAL REFERENCE CELLS, AND METHOD OF SETTING THE REFERENCE CELLS

(75) Inventors: Xian Liu, Sunnyvale, CA (US); Michael James Heinz, Livermore, CA (US); Eugene Jinglun Tam, Saratoga, CA (US); Michael K. Doan, Milpitas, CA (US); Alexander Kotov, Sunnyvale, CA (US); Tho Ngoc Dang, San Jose, CA (US); Jack Edward Frayer, Boulder Creek, CA (US); Jung Hee Yun, Fremont, CA (US); Thuan T. Vu, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/466,872

(22) Filed: May 8, 2012

(65) Prior Publication Data
US 2012/0257465 A1  Oct. 11, 2012

Related U.S. Application Data

(62) Division of application No. 12/725,370, filed on Mar. 16, 2010, which is a division of application No. 12/040,732, filed on Feb. 29, 2008, now abandoned.

(51) Int. Cl.
*G11C 16/06* (2006.01)

(52) U.S. Cl.
USPC .............. 365/185.2; 365/185.11; 365/185.21; 365/185.22; 365/185.28

(58) Field of Classification Search
USPC .............. 365/185.11, 185.2, 185.21, 185.22, 365/185.28
See application file for complete search history.

(56) References Cited

U.S. PATENT DOCUMENTS

| | | | |
|---|---|---|---|
| 5,828,601 | A | 10/1998 | Hollmer et al. |
| 6,459,620 | B1 | 10/2002 | Eshel |
| 2006/0140030 | A1 | 6/2006 | Bedarida et al. |
| 2007/0036007 | A1 | 2/2007 | Lann et al. |
| 2008/0094907 | A1* | 4/2008 | Ban .......................... 365/185.21 |
| 2008/0137433 | A1 | 6/2008 | Kim et al. |
| 2009/0129147 | A1 | 5/2009 | Yano et al. |

* cited by examiner

*Primary Examiner* — Hoai V Ho
(74) *Attorney, Agent, or Firm* — DLA Piper LLP (US)

(57) ABSTRACT

A non-volatile memory device has an array of non-volatile memory cells, a first plurality of non-volatile memory reference cells, with each reference cell capable of being programmed to a reference level different from the other reference cells; and a second plurality of comparators. Each of the comparators is connectable to one of the first plurality of non-volatile memory reference cells and to one of a third plurality of memory cells from among the array of non-volatile memory cells.

6 Claims, 4 Drawing Sheets

US 8,576,630 B2

NON-VOLATILE MEMORY DEVICE WITH PLURAL REFERENCE CELLS, AND METHOD OF SETTING THE REFERENCE CELLS

CROSS REFERENCE TO RELATED APPLICATIONS

This application is a divisional of U.S. application Ser. No. 12/725,370, filed on Mar. 16, 2010, which is a divisional of Ser. No. 12/040,732, filed Feb. 29, 2008, both of which are incorporated herein by reference.

TECHNICAL FIELD

The present invention relates to a nonvolatile memory device and more particularly to a non-volatile memory device with an array of non-volatile memory cells with a plurality of non-volatile reference cells wherein each reference cell is capable of being programmed to a different level from the other reference cells.

BACKGROUND OF THE INVENTION

A non-volatile memory device having an array of non-volatile memory cells is well known in the art. Typically, a device also has a number of non-volatile reference memory cells provided with the array. In addition, typically, multiple comparators are provided with the array of non-volatile memory cells to provide for parallel reading. Each comparator is associated with a group of the non-volatile memory cells in the array. Further, each comparator is connected to one of the reference cells, and uses the signal from the reference cell and compares it to the associated group of memory cells. Finally, in the prior art, all of the comparators are either all connected to a single non-volatile memory reference cell or all of the comparators are connected to a number of non-volatile memory reference cells wherein all of the non-volatile memory reference cells are set to the same targeted signal value.

Because of process variations, and other anomalies, the I-V (current-voltage) characteristics of individual transistors in the comparators will have different offsets and cause the comparators to have different "effective reference levels". This results in the operating window being larger than otherwise necessary to take into account such large difference in the reference levels.

SUMMARY OF THE INVENTION

Accordingly, in the present invention, a non-volatile memory device has an array of non-volatile memory cells and a first plurality of non-volatile memory reference cells. Each of the non-volatile reference cells is capable of being programmed to a reference level different from the other reference cells. In addition, the memory device comprises a second plurality of comparators. Each of the comparators is connectable to one of the first plurality of non-volatile memory reference cells and to one of a third plurality of memory cells from among the array of non-volatile memory cells.

The present invention also relates to methods for programming the non-volatile reference cells to selected target values.

DETAILED DESCRIPTION OF THE INVENTION

Figure 1:
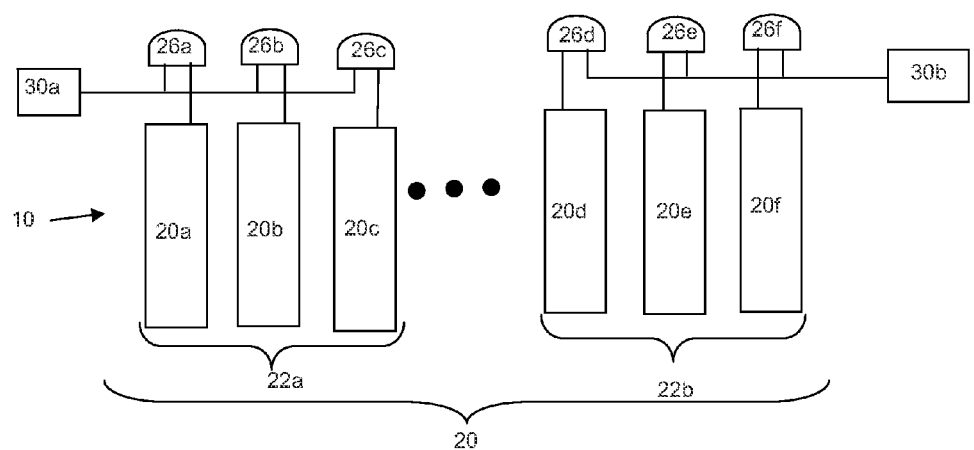
FIG. 1 is a schematic block level diagram of a memory device of the present invention.

Referring to FIG. 1, there is shown a block level diagram of a memory device 10 of the present invention. The device 10 comprises an array 20 of non-volatile memory cells. As is well known, the array 20 of non-volatile memory cells is arranged in a plurality of rows and columns, although one skilled in the art would appreciate that the term "row" and "column" may be interchanged. Further, the array 20 is divided into a plurality of groups (although only 2 groups 22a and 22b are shown, it is clear to those skilled in the art, that the array 20 may be divided into more than 2 groups). Further, within each group, e.g. 22a, the group is subdivided yet into a plurality of subgroups, e.g. 20a, 20b and 20c of non-volatile memory cells. Further, each subgroup, e.g. 20a, may comprise a plurality of non-volatile memory cells. The non-volatile memory cells that form the subgroup of cells 20a, 20b or 20c, may be stack gate floating gate, split gate floating gate, or use charge trapping layer; or use phase changing material. Further, each of the cells may be a Single Level Cell (SLC) storing a single bit or a Multi-Level Cell (MLC) storing a plurality of bits. Similarly, the group 22b comprises a plurality of subgroups 20d, 20e, and 20f, each of which may comprise a plurality of non-volatile memory cells. A comparator 26, e.g. 26a, is associated with a subgroup, e.g. 20a of non-volatile memory cells. Finally, a reference non-volatile memory cell 30 is associated with each group 22 of non-volatile memory cells, and the associated comparators 26(a-c). Alternatively, each comparator 26 may have a different reference cell 30 associated therewith. In the preferred embodiment, the reference cell 30 is of the same structure as the non-volatile memory cells in the array 20. Thus, the circuits to program, erase, and read the non-volatile memory cells in the array 20 can also be used for the reference cells 30. Each comparator, e.g. 26a has one input connected to the reference non-volatile memory cell, e.g. 30a, and the other input connectable to one of the non-volatile memory cells 20 from the subgroup 20a, with which the comparator 26a is associated.

Unlike the prior art, each of the reference memory cells 30 is programmed to a read signal (which may be a voltage signal $V_{ref}$ or a current signal $I_{ref}$, depending on the characteristics of the non-volatile memory cell and the method used to read it) different from the other reference memory cell 30. Tins difference is used to compensate for the read offset $I_{offset}$ or $V_{offset}$ resulting from process and other variations in the individual comparators. In the case where the read signal is a current signal, $I_{ref}=I_T+I_{offset}$. In the case where read signal is a voltage signal, $V_{ref}=V_T+V_{offset}$. $I_T$ or $V_T$ is the target effective reference level which differentiates between data "0" and "1" in memory data cells. This level is generally selected based on memory cell and sensing circuit characteristics. Thus, process variations during the manufacturing of the device 10, (especially for the comparators 26 (a-c) associated with reference cell 30a and comparators 26(d-f) associated with reference cell 30b) may be compensated by being able to program each reference cell 30 to a different level. In this manner, the operating window for the device 10 may be tightened.

To program each of the non-volatile reference memory cell 30 to a different read signal than the other non-volatile reference memory cell 30 in order to compensate for comparator offsets, there are three methods.

Figure 2A:
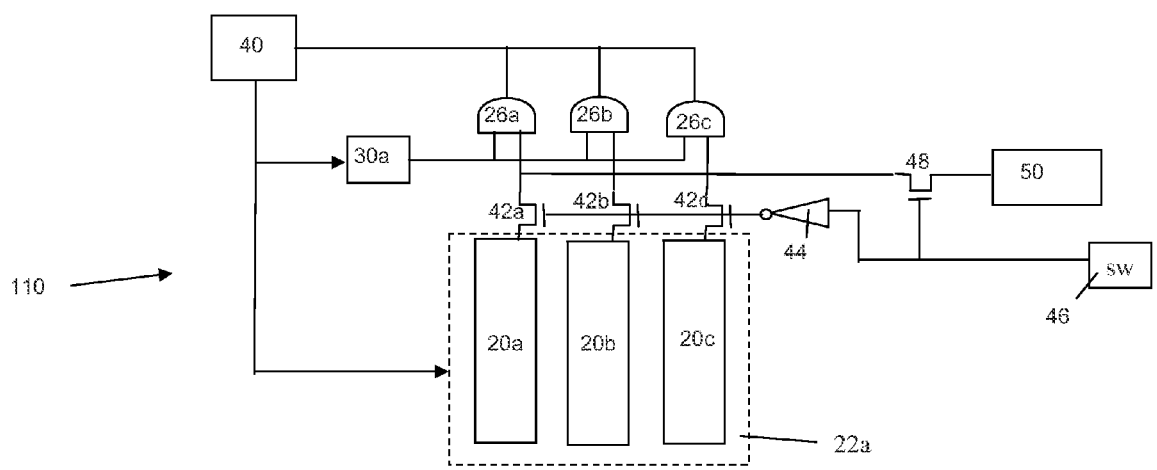
FIG. 2A is a schematic block level diagram of one embodiment of the memory device of the present invention showing the programming of the reference cells.

Referring to FIG. 2A there is shown a Hock level diagram of the device 110 capable of performing the first method of the present invention. The device 110 is similar to the device 10 and hence, like numerals will be used to designate like parts. The device 110 has an array 20 of non-volatile memory cells, divided into a plurality of subgroups of non-volatile memory cells 20(a-c) formed in a group 22a. Although only three subgroups 20(a-c) are shown forming one group 22a, it is clear that there are other groups 22x, with other subgroups 20x forming the array 20 of non-volatile memory cells. In addition, each subgroup, e.g. 20a has an associated comparator 26a. Finally a reference cell 30a is associated with the group 22a of non-volatile memory cells, similar to that described and shown in FIG. 1.

A read out signal from non-volatile memory cells from each subgroup, e.g. 20a is supplied, along the bit line, to one input of the associated comparator, e.g. 26a through an associated switch 42a. Another input to each of the comparators 26(a-c) is supplied from the reference cell 30a. During the read operation, the comparator 26 generates data "0" if the read signal from the one input represents over-programmed state as compared to the read signal from the other input (e.g. $I_{data} < I_{ref} - I_{offset}$), and data "1" if otherwise. The output data of each comparator 26 is supplied to a programming circuit 40, which controls the programming of the reference cell 30 and of data cells in the array 20. The one input of each comparator 26 is also connected to a source 50 (either current source or voltage source) through another switch 48. The source 50 is set to the target effective reference level $I_T$ or $V_T$. The source 50 can be a circuit on board with the integrated circuit device 110 or it can be supplied external to the device 110, as in for example, a pad used during testing. An inverter 44 is connected to the switches 42(a-c). A switch signal 46 is supplied to the inverter 44 and the other switch 48.

In operation, the switch signal 46 is first activated such that the transistor 48 is on and transistors 42(a-c) are off, thereby causing the signal from the source 50 to be supplied to each of the comparators 26. The reference cell 30a is erased. The programming circuit 40 then weakly programs the reference cell 30a. As used herein, the condition of this initial program operation (i.e. weakly program) is chosen so that the reference cell 30a is not over-programmed, as verified by a subsequent read which is discussed below. A read operation of the reference cell 30a is performed and the read signal is compared to the signal from the source 50 using the comparators 26(a-c). If the reference cell 30a is current based, the current $I_{ref}$ read from the reference cell 30a is compared to the current $I_T$ from the source 50. In the event that the reference cell 30a is under programmed (i.e. data="0", corresponding to $I_{ref} > I_T + I_{offset}$) for more than 50% of the comparators 26 in the group 22a with which the reference cell 30a is associated, then the programming circuit 40 causes further programming of the reference cell 30a.

Figure 2B:
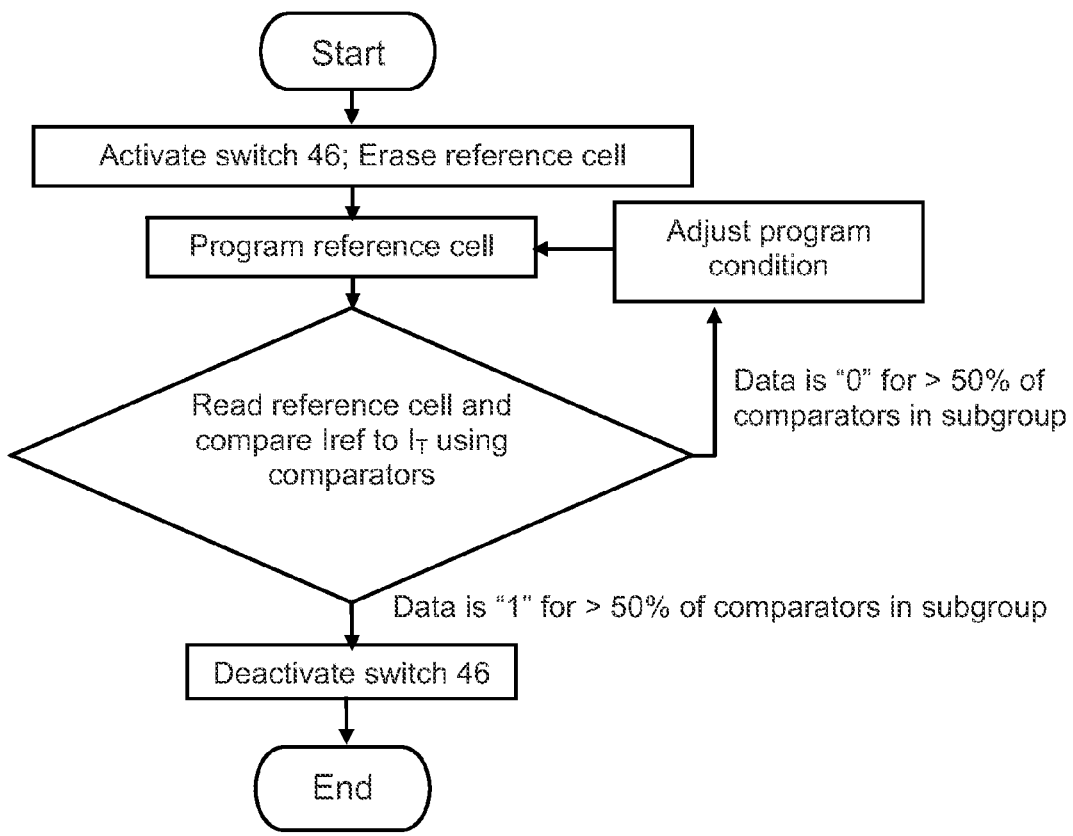
FIG. 2B is a flowchart showing the method of programming the reference cells in accordance with the embodiment shown in FIG. 2A.

When additional programming of the reference cell 30a occurs, the conditions of programming may be changed so that the rate of electron injection for programming remains the same as previously, thereby maintaining a substantially constant rate of electron injection. As is well known to those skilled in the art, the condition of under programming of $I_{ref} > I_T + I_{offset}$ is caused by more current flowing in the channel of the reference cell 30a, due to less electrons being stored on the floating gate. Of course, with other types of non-volatile memory cells, the condition of under programming may not necessarily result in $I_{ref} > I_T + I_{offset}$. Once the reference cell 30a is programmed to the correct state, (i.e. data="1", corresponding to $I_{ref} < I_T + I_{offset}$, for more than 50% of the comparators 26 in the group 22a with which the reference cell 30a is associated,) programming of the reference cell 30a is completed. Other reference cells 30 in the circuit are programmed similarly. Programming of multiple reference cells 30 can be done in parallel or in series. When reference cells 30 are programmed in parallel, those reference cells 30 which have passed verification are deselected to prevent them from being programmed further, white programming continues for those reference cells 30 which have not passed verification. Once programming of all reference cells 30 is completed, the switch signal 46 is reversed to prepare for normal data write and read operations. This causes the switch 48 to be turned off, and transistors 42(a-c) to be turned on, resulting in the one input for each comparator 26 being supplied with the signal from the non-volatile memory data cells in the subgroup 20 with which the comparator 26 is associated. A flow chart of this method is schematically shown in FIG. 2B.

Figure 3A:
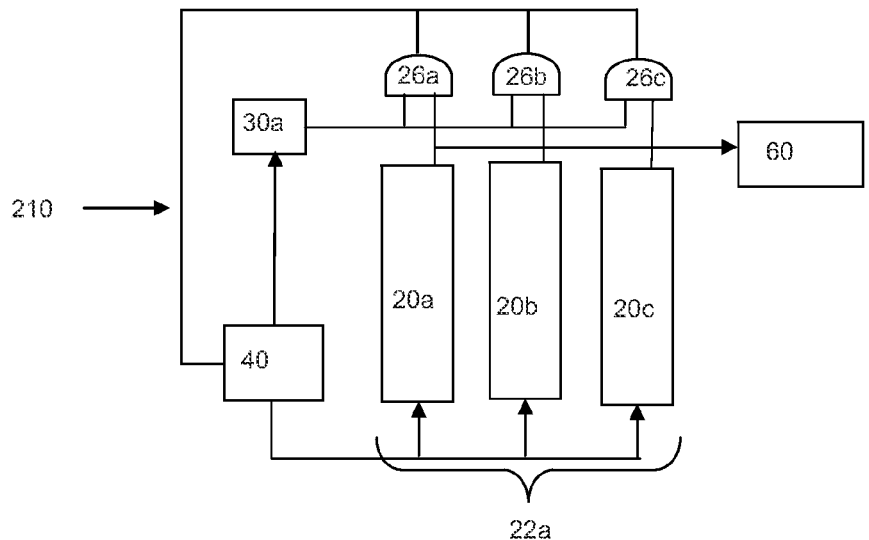
FIG. 3A is a schematic block level diagram of another embodiment of the memory device of the present invention showing the programming of the reference cells.

Referring to FIG. 3A there is shown a block level diagram of the device 210 capable of performing the second method of the present invention. The device 210 is similar to the device 110 and device 10 and hence, like numerals will be used to designate like parts. The device 210 has an array 20 of non-volatile memory cells, divided into a plurality of subgroups of non-volatile memory cells 20(a-c) formed in a group 22a. Although only three subgroups 20(a-c) are shown forming one subgroup 22a, it is clear that there are other groups 22x, with other subgroups 20 forming the array 20 of non-volatile memory cells. In addition, each subgroup, e.g. 20a has an associated comparator, e.g. 26a. Finally a reference cell 30a is associated with the group 22a of non-volatile memory cells, similar to that described and shown in FIGS. 1 and 2A.

Read out from non-volatile memory cells from each subgroup, e.g. 20a is supplied, along the bit line, to one input of the associated comparator, e.g. 26a. In addition, the read out is supplied to a source 60 such as an output bonding pad, such that the read-out may be measured. Another input to each of the comparators 26(a-c) is supplied from the reference cell 30a. During the read operation, the comparator 26 generates data "0" if the read signal from the one input represents over-programmed state as compared to the read signal from the other input (e.g. $I_{data} < I_{ref} - I_{offset}$), and data "1" if otherwise. A programming circuit 40 controls the programming of the reference cell 30, as well as each non-volatile memory cell within each subgroup 20.

In operation, the reference cell 30a and data cells in the subgroups 20(a-c) are first erased. The programming circuit 40 then weakly programs the reference cell 30a. The condition of this initial reference cell program operation is chosen so that the reference cell 30a is not to be over-programmed, as verified by a subsequent verification discussed below. The programming circuit 40 then softly programs each of the non-volatile memory data cells in the group 22a, with which the reference cell 30a is associated. Again, the condition of this initial data cell program operation is set so that the data cells are not to be over-programmed, as verified by a subsequent read discussed below. A read operation is performed on each of the data cells in subgroups 20(a-c) and on the reference cell 30a, and the read signals are compared by the comparators 26. If any of the data cells is under programmed (i.e. data is "1", corresponding to $I_{data}>I_{ref}-I_{offset}$), then the programming circuit 40 is activated to further program the data cells which read "1", while the data cells which read "0" are deselected to prevent them from being programmed further. When additional programming of the data cells occurs, the conditions of programming may be adjusted so that the rate of electron injection for programming is the same as previously, thereby maintaining a substantially constant rate of electron injection.

Figure 3B:
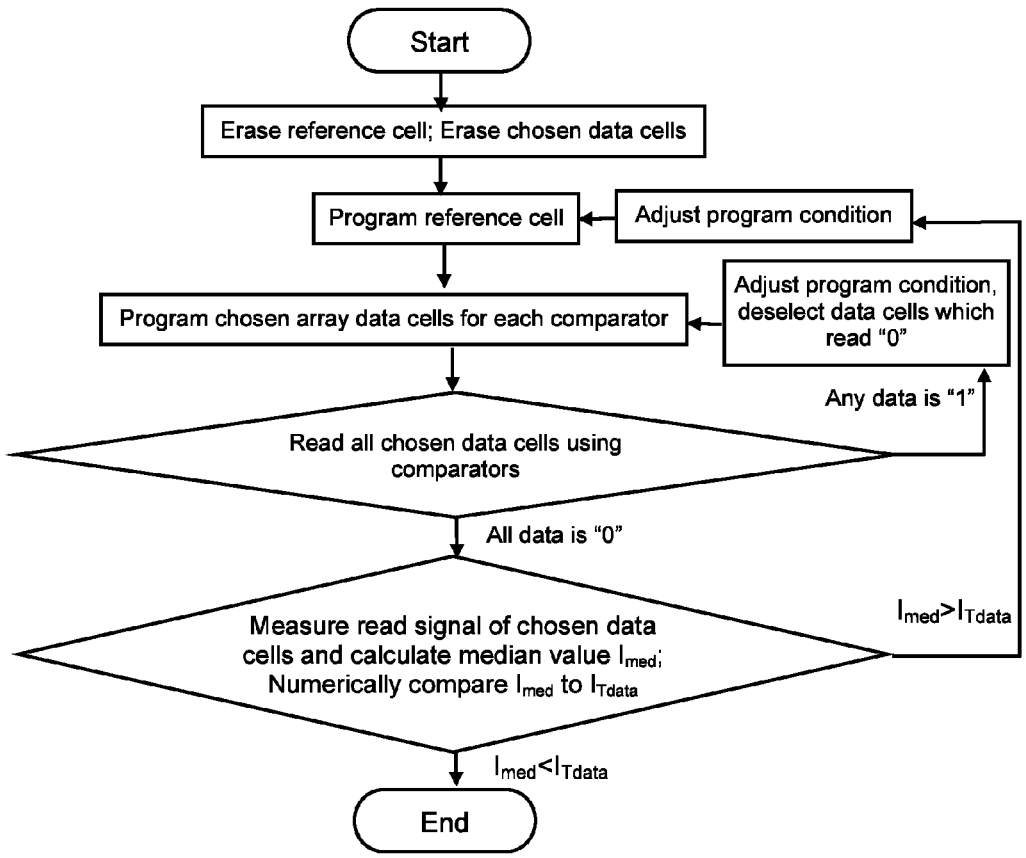
FIG. 3B is a flowchart showing the method of programming the reference cells in accordance with the embodiment shown in FIG. 3A.

Alternatively, to save time, rather than programming all of the data memory cells in each of the subgroups 20(a-c), a select few (even as few as one) memory cells may be chosen from each subgroup 20(a-c) to be programmed and compared at this step. After all chosen data cells are sufficiently programmed to read "0", the programmed chosen data cells are read and the read signals are individually supplied to the source 60 to be measured. The median value $I_{med}$ of the read signals from data cells associated with the same reference cell 30a, is then calculated. The calculated median value $I_{med}$ is numerically compared to a target value $I_{Tdata}$, which is the expected read signal from a typical programmed data cell which first passes verification with the target effective reference level $I_T$. The target value for a "typical programmed data cell" $I_{Tdata}$ corresponds to slightly over-programmed charge state compared to the target effective reference level $I_T$, due to the finite change in data cell charge state after every program operation. Thus, $I_{Tdata}=I_T=I_{overshoot}-I_{overshoot}$, the difference between $I_T$ and $I_{Tdata}$, can be derived from data cell programming characteristics. When $I_{med}$ reaches $I_{Tdata}$ the method stops. However, in the event $I_{med}$ has not reached $I_T$, then the programming circuit 40 is activated to further program the reference cell 30a. When additional programming of the reference cell occurs, the conditions of programming may be adjusted so that the rate of electron injection for programming is the same as previously, thereby maintaining a substantially constant rate of electron injection. A flow chart of this method is schematically shown in FIG. 3B. Other reference cells 30 in the circuit are programmed similarly. Programming of multiple reference cells can be done in parallel or in series. When reference cells are programmed in parallel, those reference cells which have passed verification are deselected to prevent them from being programmed further, while programming continues for those reference cells which have not passed verification.

Figure 4A:
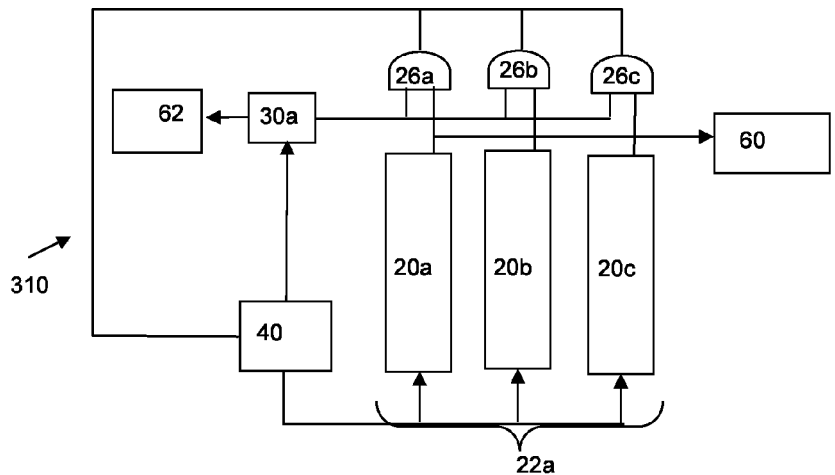
FIG. 4A is a schematic block level diagram of yet another embodiment of the memory device of the present invention showing the programming of the reference cells.

Referring to FIG. 4A there is shown a block level diagram of the device 310 capable of performing the third method of the present invention. The device 310 is similar to the device 210 and the device 110 and device 10 and hence, like numerals will be used to designate like parts. The device 310 has an array 20 of non-volatile memory cells, divided into a plurality of subgroups of non-volatile memory cells 20(a-c) formed in a group 22a. Although only three subgroups 20(a-c) are shown forming one subgroup 22a, it is clear that there are other groups 22x, with other subgroups 20 forming the array 20 of non-volatile memory cells. In addition, each subgroup, e.g. 20a has an associated comparator 26a. Finally a reference cell 30a is associated with the group 22a of non-volatile memory cells, similar to that described and shown in FIGS. 1, 2A, and 3A.

Read out from non-volatile memory cells from each subgroup, e.g. 20a is supplied, along the bit line, to one input of the associated comparator, e.g. 26a. In addition, the read out is supplied to a first source 60 such as an output bonding pad, such that the read-out may be measured. Another input to each of the comparators 26(a-c) is supplied from the reference cell 30a. During read, the comparator 26 generates data "0" if the read signal from the one input represents over-programmed state as compared to the read signal from the other input (e.g. $I_{data}<I_{ref}-I_{offset}$), and data "1" if otherwise. The reference cell 30a may also be read out and supplied to a second source 62, such as an output bonding pad, such that the read out of the reference cell 30a may be measured. A programming circuit 40 controls the programming of the reference cell 30, as well as each non-volatile memory cell within each subgroup 20.

In operation, the reference cell 30a and data cells in the subgroups 20(a-c) are first erased. The programming circuit 40 then weakly programs the reference cell 30a. The condition of this initial reference cell program operation is chosen so that the reference cell 30a is not to be over-programmed, as verified by a subsequent verification discussed below. The reference cell 30a is read and the signal level so read is supplied to the second source 62, where the current/voltage is measured. The measured read signal from the reference cell 30a $I_{ref}$ is then numerically compared to a target level $I_{T+}$. $I_{T+}$ is chosen to represent a slightly under-programmed charge state as compared to the target effective reference level $I_T$, i.e. $I_{T+}>I_T$, and $I_{T+}-I_T$ is larger than expected $I_{offset}$ generated by any of the comparators 26 in the circuit. If $I_{ref}>I_{T+}$ then the programming circuit 40 is activated to further program the reference cell 30a. When additional programming of the reference cell occurs, the conditions for programming may be adjusted so that the rate of electron injection for programming is the same as previously, thereby maintaining a substantially constant rate of electron injection. Once $I_{ref}$ reaches $I_{T+}$, then the programming circuit 40 weakly programs each of the non-volatile memory data cells in the group 22a, with which the reference cell 30a is associated. The condition of this initial data cell program operation is chosen so that any of the data cells is not to be over-programmed, as verified by a subsequent read discussed below.

Figure 4B:
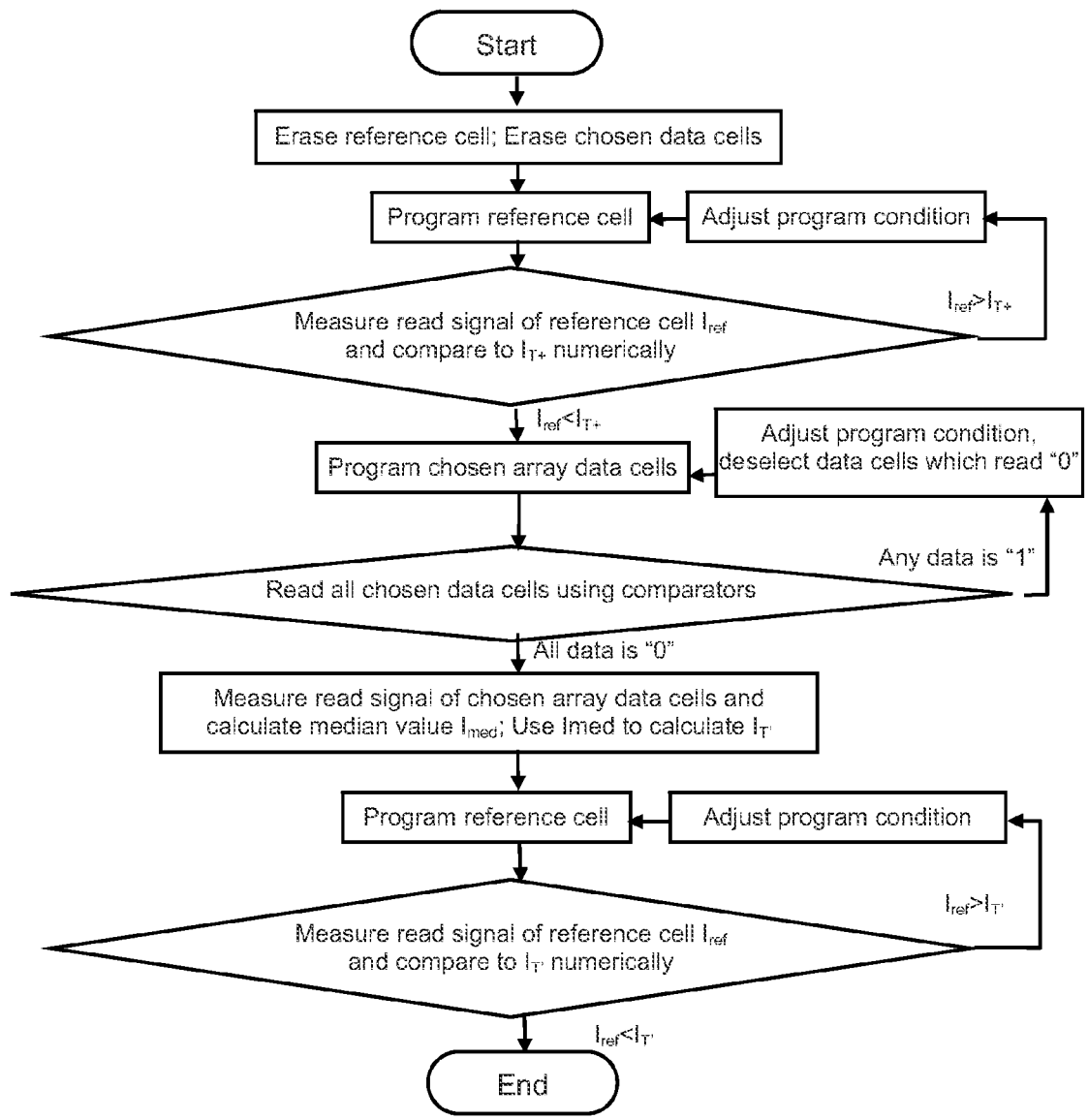
FIG. 4B is a flowchart showing the method of programming the reference cells in accordance with the embodiment shown in FIG. 4A.

A read operation is performed on the data cells in each subgroup 20(a-c) and on the reference cell 30a, and the results are compared by the comparators 26. If any of the data cells are under programmed, i.e. data is "1", corresponding to $I_{data}>(I_{ref}-I_{offset})$, then the programming circuit 40 is activated to further program the data cells in the group 22a which read data "1", while data cells which read data "0" are deselected to prevent them from being programmed further. When additional programming of the data cells occurs, the conditions for programming may be adjusted so that the rate of electron injection for programming is the same as previously, thereby maintaining a substantially constant rate of electron injection. Alternatively, to save time, rather than programming all of the data memory cells in each of the subgroups 20(a-c), a select few (even as few as one) memory cell may be chosen from each subgroup 20(a-c) to be programmed and compared at this step. After all chosen data cells are sufficiently programmed to read "0", the programmed data cells are read and the read signals are individually supplied to the source 60 to be measured. The median value $I_{med}$ of the read signals from chosen data cells associated with the same reference cell 30a, is then calculated. The calculated median value $I_{med}$ is used to define a read signal target $I_{T'}$ for the reference cell 30a, where $I_{T'}=I_T-I_{T+}+I_{med}+I_{overshoot}$. Once $I_{T'}$ is defined and calculated, the reference cell 30a is then further programmed by the programming circuit 40. The reference cell 30a is read and the signal level so read is supplied to the second source 62, where the read signal is measured. The measured read signal from the reference cell 30a $I_{ref}$ is then numerically compared to the target level $I_{T'}$. In the event the reference cell 30a is under programmed, i.e. $I_{ref}>I_{T'}$ then the programming circuit is activated again to further program the reference cell 30a. When additional programming of the data cells occurs, the conditions for programming may be adjusted so that the rate of electron injection for programming is the same as previously, thereby maintaining a substantially constant rate of electron injection. In the event the reference cell 30a has reached the target $I_T$, i.e. $I_{ref} < I_T$, then the method ends. A flow chart of this method is schematically shown in FIG. 4B. Other reference cells 30 in the circuit are programmed similarly. Programming of multiple reference cells can be done in parallel or in series. When reference cells are programmed in parallel, those reference cells which have passed verification are deselected to prevent them from being programmed further, while programming continues for those reference cells which have not passed verification.

What is claimed is:

1. A method of programming a first plurality of reference cells in a memory device having an array of non-volatile memory cells and a second plurality of comparators comprising:
   (i) programming one of said first plurality of reference cells;
   (ii) programming a third plurality of non-volatile memory cells, wherein said third plurality is associated with one of said second plurality of comparators;
   (iii) reading said third plurality of non-volatile memory cells using one of said second plurality of comparators and a reference voltage;
   (iv) continuing the programming of said third plurality of non-volatile memory cells based upon said reading;
   (v) measuring the read signals of the third plurality of non-volatile memory cells;
   (vi) calculating the median value of the signals from the measured signals of the third non-volatile memory cells; and
   (vii) continuing the programming of said one of said first plurality of reference cells based upon said calculation.

2. The method of claim 1 further comprising:
   wherein the programming step (i) programs said first plurality of reference cells in parallel;
   wherein the reading step (iii) reads each of said plurality of non-volatile memory cells using a different one of said second plurality of comparators
   wherein the calculating step (vi) calculates the median value of the signals from the measured signals of the third non-volatile memory cells associated with a different one of each of said first plurality of reference cells;
   wherein said method further comprising: deselecting reference cells from said first plurality of reference cells based upon said calculation, after step (vi); and
   wherein the continuing step (viii) continues the programming of reference cells from the first plurality of reference cells which have not been deselected.

3. The method of claim 1 further comprising:
   repeating the steps of (i)-(vii) for a different one of said first plurality of reference cells.

4. The method of claim 1 wherein said continuing of programming is done by adjusting program conditions so as to maintain a substantially constant rate of electron injection.

5. The method of claim 1 wherein said one of said first plurality of reference cells is associated with a third plurality of comparators, wherein said third plurality of comparators is a subset of said second plurality of comparators, and said reading step reads said programmed reference cells and the read signal is compared to a reference signal for each one of said third plurality of comparators.

6. The method of claim 1, wherein each reference cell from the first plurality of reference cells has an associated different comparator from the second plurality of comparators.

* * * * *